United States Patent [19]
Gorman

[11] Patent Number: 6,101,125
[45] Date of Patent: Aug. 8, 2000

[54] ELECTRICALLY PROGRAMMABLE MEMORY AND METHOD OF PROGRAMMING

[75] Inventor: Alistair James Gorman, East Kilbride, United Kingdom

[73] Assignee: Motorola, Inc., Schaumburg, Ill.

[21] Appl. No.: 09/082,213

[22] Filed: May 20, 1998

[30] Foreign Application Priority Data

May 21, 1997 [GB] United Kingdom .................. 9710493

[51] Int. Cl.[7] .................................................. G11C 16/04
[52] U.S. Cl. ................................ 365/185.19; 365/185.03
[58] Field of Search ......................... 365/185.19, 185.03, 365/189.04

[56] References Cited

U.S. PATENT DOCUMENTS

| 5,553,020 | 9/1996 | Keeney et al. ..................... 365/185.19 |
| 5,768,184 | 6/1998 | Hayashi et al. ..................... 365/185.03 |
| 5,768,191 | 6/1998 | Choi et al. ..................... 365/185.03 X |
| 5,892,710 | 4/1999 | Fiazio et al. ....................... 365/185.03 |
| 5,909,390 | 6/1999 | Harari ............................. 365/185.19 X |

*Primary Examiner*—D. Hyein Yoo

[57] ABSTRACT

An electrically programmable memory having floating gate FET cells (10.2) each having a drain electrode (10.10), and a source electrode (10.8); a first voltage source for applying simultaneously to one of the drain and source electrodes of a plurality of cells of the memory a first voltage (AGND) for a programming time, the first voltage being selectable so as to determine the multi-level value programmed into the cell, thereby allowing simultaneous multi-level programming of the plurality of cells; a voltage pluse source for applying to the other of the drain and source electrodes of the plurality of cells a succession of voltage pulses (Vpp) during the programming time; and a programming determiner for determining after each of the succession of the voltage pulses whether the cell is programmed to a desired value.

4 Claims, 10 Drawing Sheets

ELECTRICALLY PROGRAMMABLE MEMORY AND METHOD OF PROGRAMMING

FIELD OF THE INVENTION

This invention relates to an electrically programmable memory, and particularly, though not exclusively, to an electrically erasable programmable read-only memory (EEPROM or E$^2$PROM).

BACKGROUND OF THE INVENTION

In the field of memories generally and E$^2$PROMs in particular there is increasing interest in the development of multi-level technologies, particularly at 2 bits/cell level. For these technologies, one of the most critical features is the control of the threshold voltage (Vt) distribution width. However, to date this control is not simple and is influenced by a number of variables both in the process and design, including tunnel oxide thickness, charge pump output voltage and junction avalanche voltages to name but a few. A limited number of schemes have been published which attempt to control these variables to acceptable levels (see, for example, "A 3.3V 128Mb Multi-Level NAND Flash Memory for Mass Storage Applications" by Tae-Sung Jung et al., Samsung Electronics and "A 2.5V 256-Level Non-Volatile Analog Storage Device Using EEPROM Technology" by Hieu Van Tran et al., Information Storage Devices, both presented at ISSCC 1996). However, none of these published schemes are truly self-limiting and are still very dependent on a stable and well characterised process/design to yield tight and repeatable Vt distributions.

One proposed self-limiting scheme for Fowler-Nordheim (FN) programmed E$^2$PROMs has been published in GB patent publication GB-A-2,304,947. This scheme relies on the fact that as an E$^2$PROM cell is programmed, the cell Vgs voltage increases. If the programming biasing is set appropriately, the cell will conduct at a given level of programming and allow current to flow down the bitline to a biased array ground node, as shown in FIG. 2. Due to resistive drops down the bitline programming path (and finite charge pump output impedance), the programming voltage at the floating gate transistor drain will drop as the cell begins to conduct, and hence will limit the final programmed Vt. If different array ground biases are utilised, then this scheme can be used to generate multi-level states and together with a multi-level sensing scheme, form the core of a multi-level E$^2$PROM module.

However, the scheme described in GB-A-2,304,947 has a number of limiting factors which have so far prevented it from being developed into a practical dense EEPROM array. These are as follows:

The scheme provides no obvious means of programming multiple bits/bytes (to different states) in parallel whilst using a common array ground and single high voltage charge pump.

The absolute drop in bitline voltage during programming depends not only on the target programmed cell turning on, but also on the leakage from unselected cells in the common bitline and common rowline and the number of cells under programming bias that are shared by the same bitline driver.

In practice, the drop in bitline voltage slows the rate of programming and will not stop programming completely. Therefore, additional control is required to disable drive to bitlines where the cell has reached its target, in order that tight Vt distributions are obtained.

Accordingly, a need exists for an electrically programmable memory and a method of programming an electrically programmable memory wherein the above mentioned disadvantages may be overcome or at least alleviated.

BRIEF DESCRIPTION OF THE DRAWINGS

One E$^2$PROM memory cell array in accordance with a preferred embodiment of the present invention will now be described, by way of example only, with reference to the accompanying drawings, in which.

DETAILED DESCRIPTION OF A PREFERRED EMBODIMENT

Figure 10:
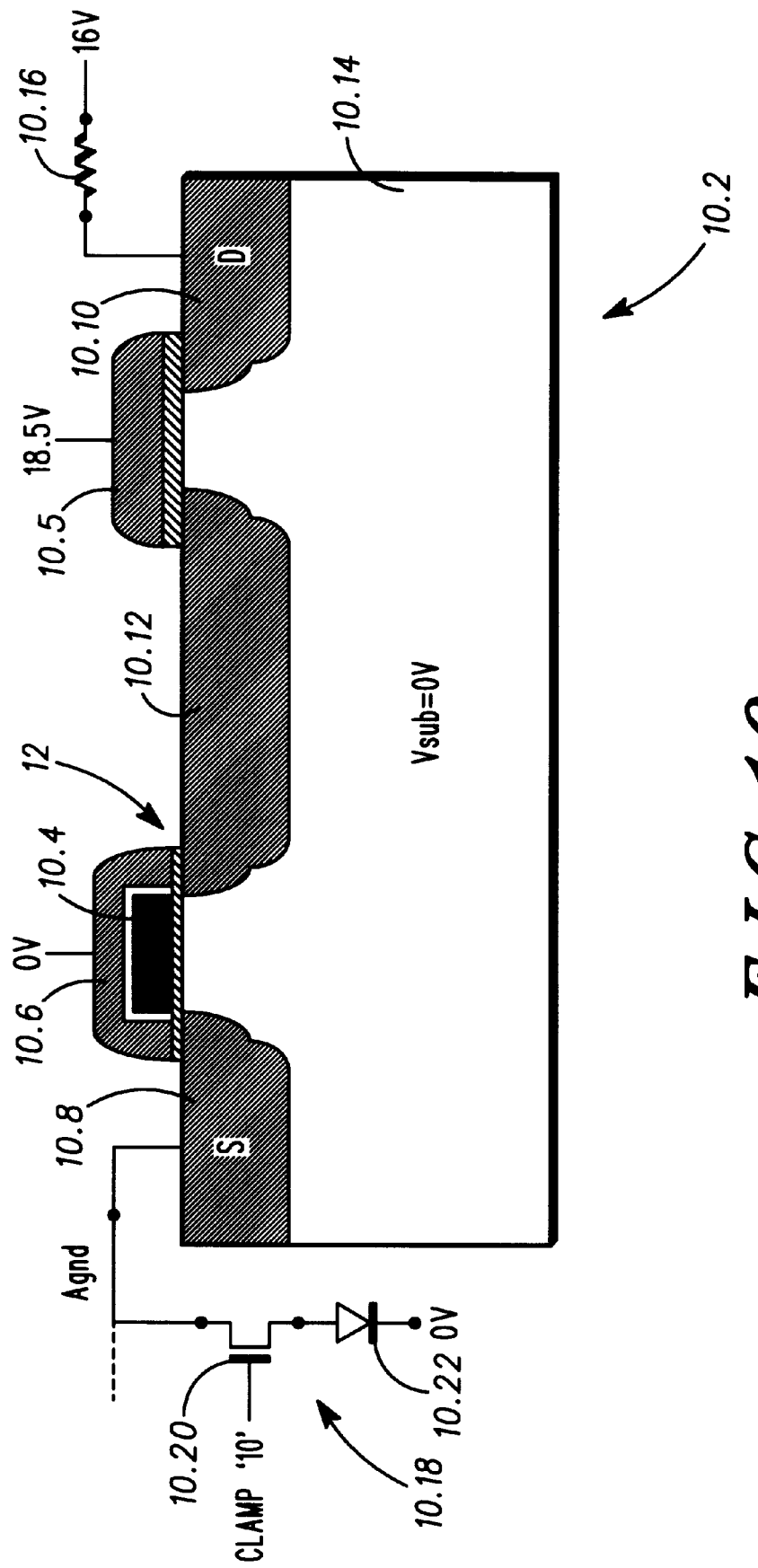
FIG. 10 is a schematic cross-sectional diagram of a cell of the array illustrating the application of various bias voltages during self-limiting programming thereof.

Referring firstly to FIG. 10, in an E$^2$PROM cell array, an E$^2$PROM cell 10.2 used for 2-bit (four level) programming includes a field-effect transistor metal-oxide-semiconductor (FETMOS) double-polysilicon structure 12 with a floating gate 10.4 as the charge storage region. The cell 10.2 also has a control gate 10.6. The floating gate 10.4 and the control gate 10.6 connect source and drain regions 10.8 and 10.10 respectively via an intermediate conductive region 10.12 in substrate 10.14. Cell 10.2 also includes a select gate 10.5. As will be discussed in more detail below, in self-limiting programming of the cell the drain region 10.10 is coupled to a voltage of approximately 16V via a current limiting resistor 10.16, and the array ground Agnd is coupled to the source region 10.8 with a clamping arrangement 10.18. The clamping arrangement 10.18 has a switching transistor 10.20 which connects the array ground Agnd line to ground (0V) via one (or more, not shown) forward-biased diodes 10.22, the voltage drop across which determines the programming level of the cell.

Figure 1:
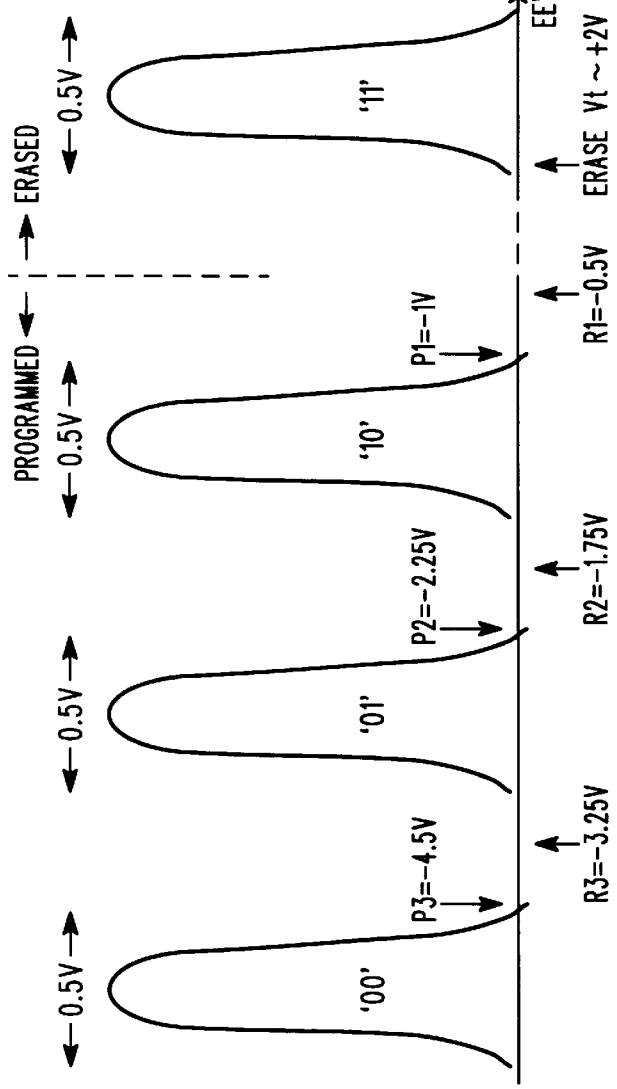
FIG. 1 shows target threshold voltages (Vt's) and read/program verify reference points of a multi-level E$^2$PROM memory cell of the array.

In order to create multiple-bit/cell schemes, typically three programmed states (in a two transistor E$^2$PROM cell as shown in FIG. 10) or three erased states (in a single transistor flash-derived cell) are used. For example, FIG. 1 shows a four level (2-bit) programming scheme for a two transistor E$^2$PROM cell which requires three programmed distributions (negative Vt's) of width 0.5V (or less). These programmed distributions provide three of the possible programmed states ('00', '01' and '10'), the fourth state ('11') being the unprogrammed or erased condition of the cell.

Figure 2:
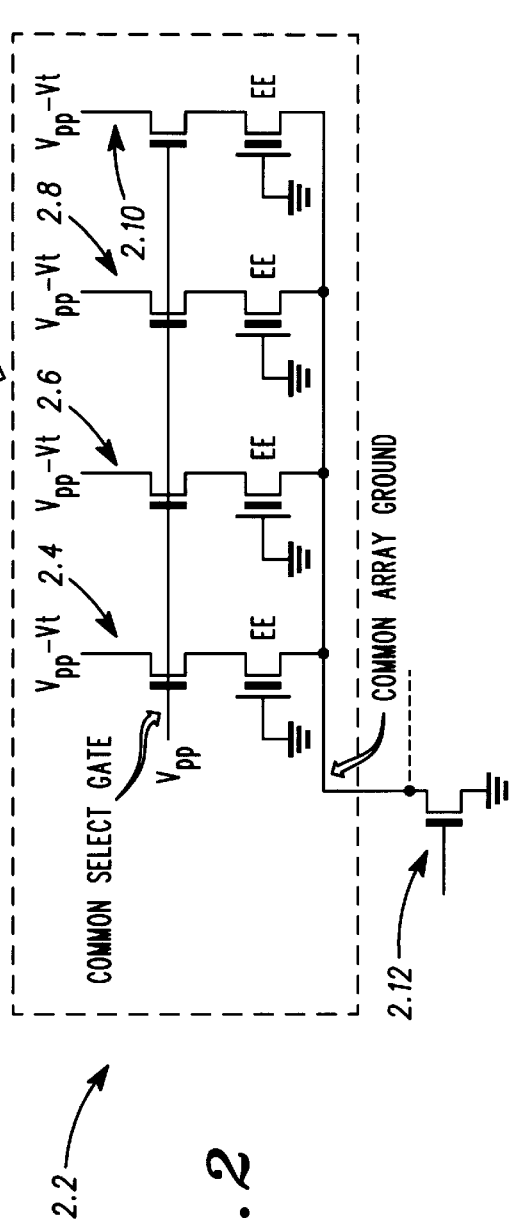
FIG. 2 is a schematic circuit diagram of four cells of the array used to store a byte of data, each of the four cells storing two data bits.
Figure 3:
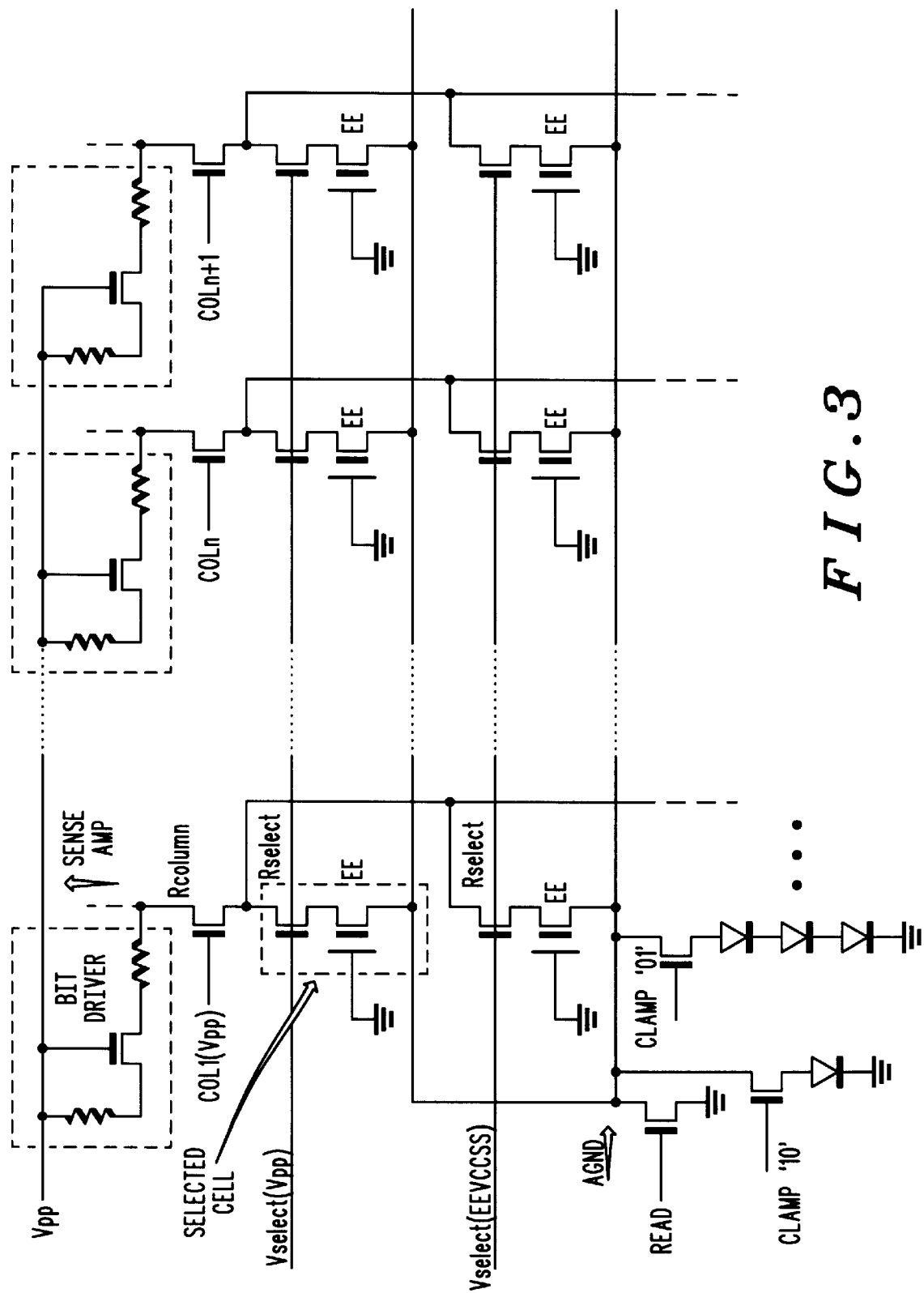
FIG. 3 is a schematic circuit diagram of part of the array illustrating a selected cell.
Figure 9:
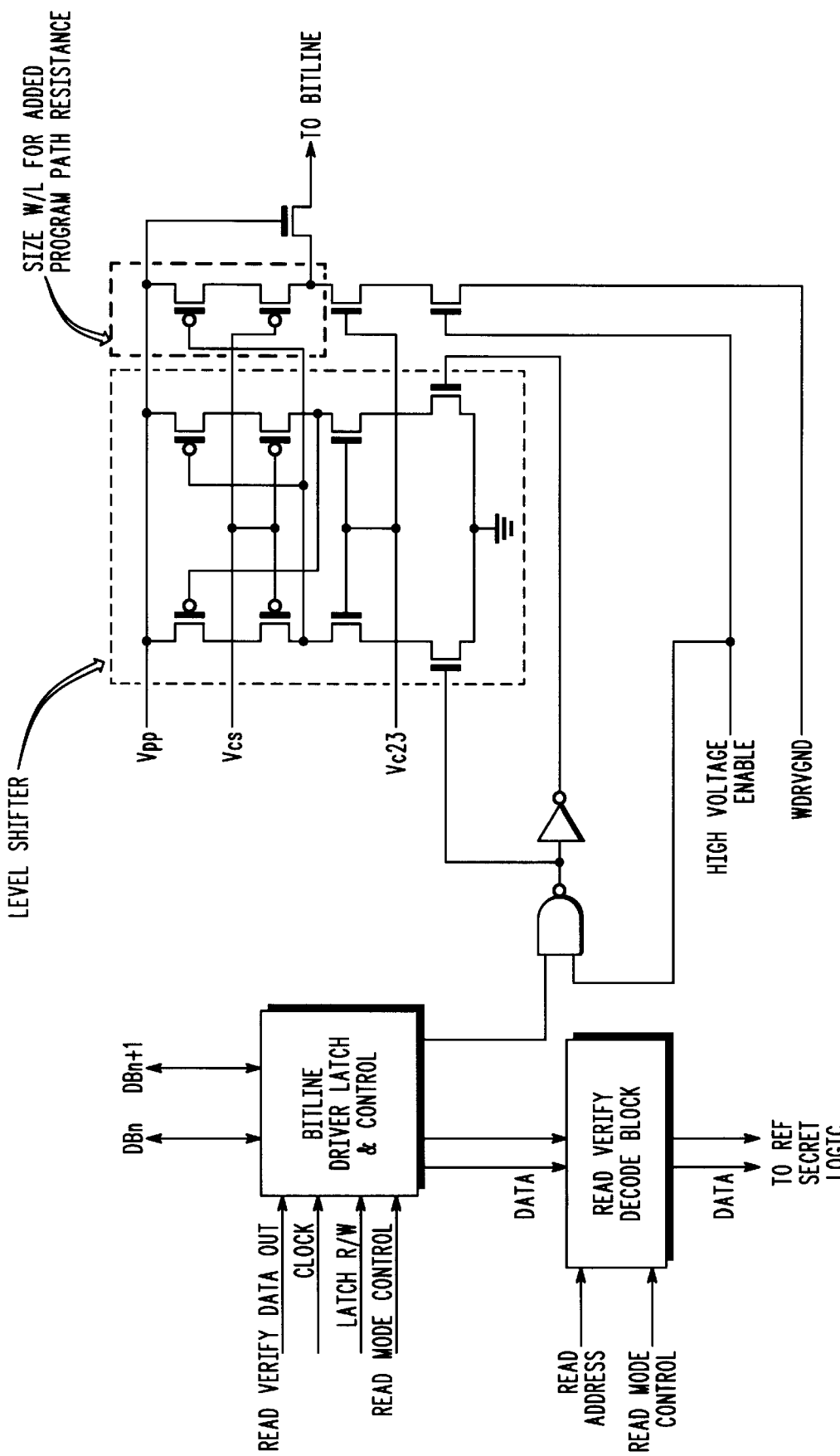
FIG. 9 is a schematic circuit diagram illustrating in more detail a bit driver control circuit shown in the system of FIG. 4.

Reference is now also made to FIG. 2, which shows a logical byte (2-bits/cell, 4 cells) 2.2 under programming biases where each cell 2.4, 2.6, 2.8, 2.10 is to be programmed to the same target Vt (either '00', '01' or '10' state as per FIG. 1). In order to use the self limiting concept, a bias of 0–4V can be applied on the common array ground and simultaneously a programming pulse or pulses can be applied to the common select gate and drain of the cell. Taking the example shown with the array ground passed to ground via an array ground transistor 2.12, the floating gate cell will start to conduct as soon as the floating gate potential rises, and therefore the cell Vgs rises, above the natural Vt of the cell (typically 0–0.2V). Due to the resistive drop in the programming path, including bitline resistance and bitline driver circuitry (shown simply in FIG. 3 and in more detail in FIG. 9), the drain voltage of the floating gate transistor will start to drop and slow down the rate of further programming (not completely stop). Depending on the total programming time, program path resistance and the available charge pump current, the final Vt will limit close to 0V. Similarly, the common array ground can be clamped to other biases (e.g., 2, 3 & 4.5V) as shown in FIG. 10 and the above process repeated to obtain other states.

However, in a practical application there is a need to program the four different cells of the byte to different values and also to reduce the overall programming time, by programming up to 32 bytes in parallel. To use a simple clamping scheme as described above is not feasible, since potentially each cell needs a different array ground clamp voltage at any one time, which is clearly not possible with a common array ground. An obvious solution is to split the array ground and multiplex the 3 possible array ground clamping biases to the source side of the floating gate transistors. However, this would drastically reduce the effective array density and detract from the prime purpose of multi-level technology which is to increase (ideally, for a 2-bit/cell arrangement, to double) the effective array density. It would also be completely impractical for multi-byte programming since the array ground line into each cell would then have to be unique in that row.

Figure 4:
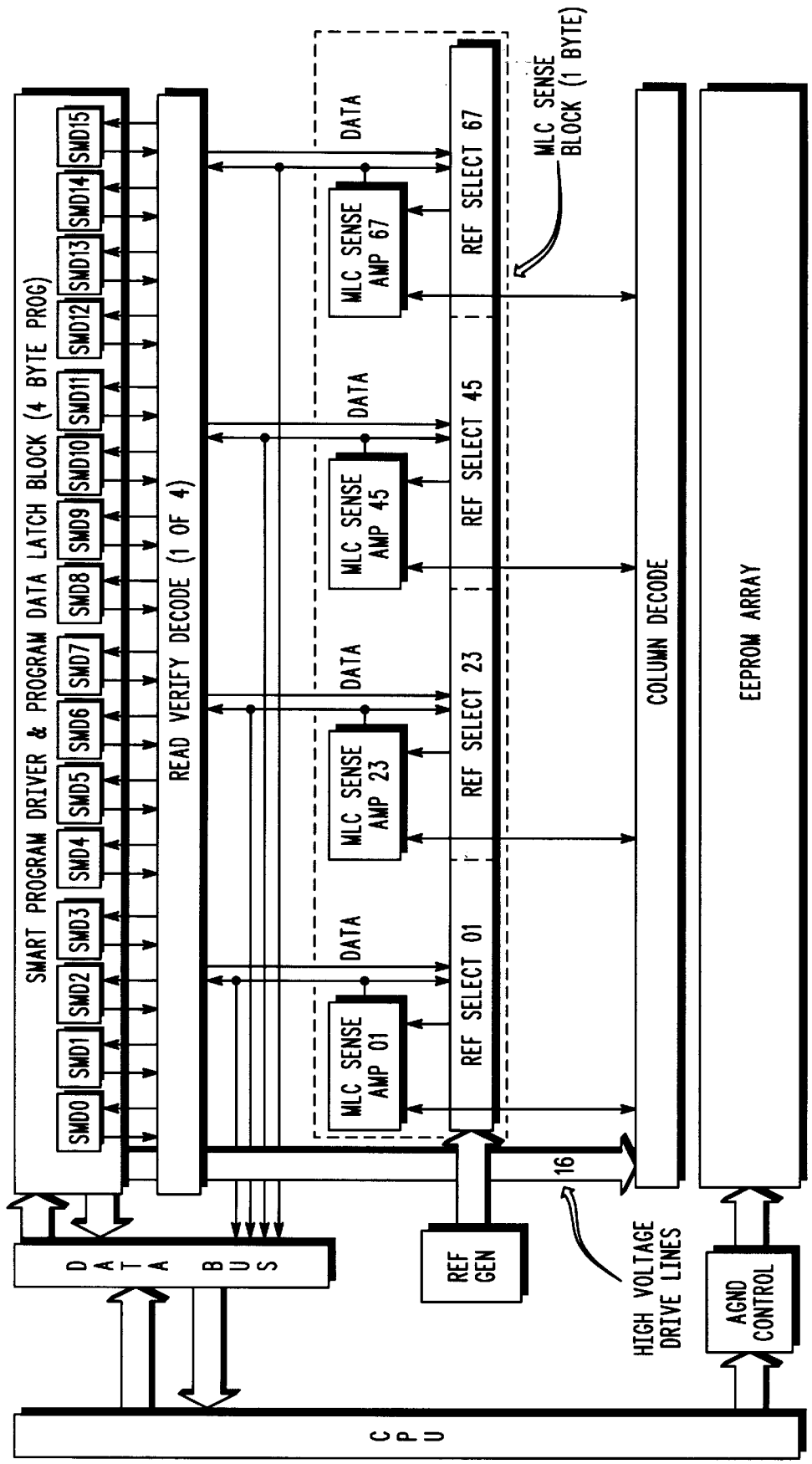
FIG. 4 is a block-schematic diagram of the array in a CPU system.
Figure 6:
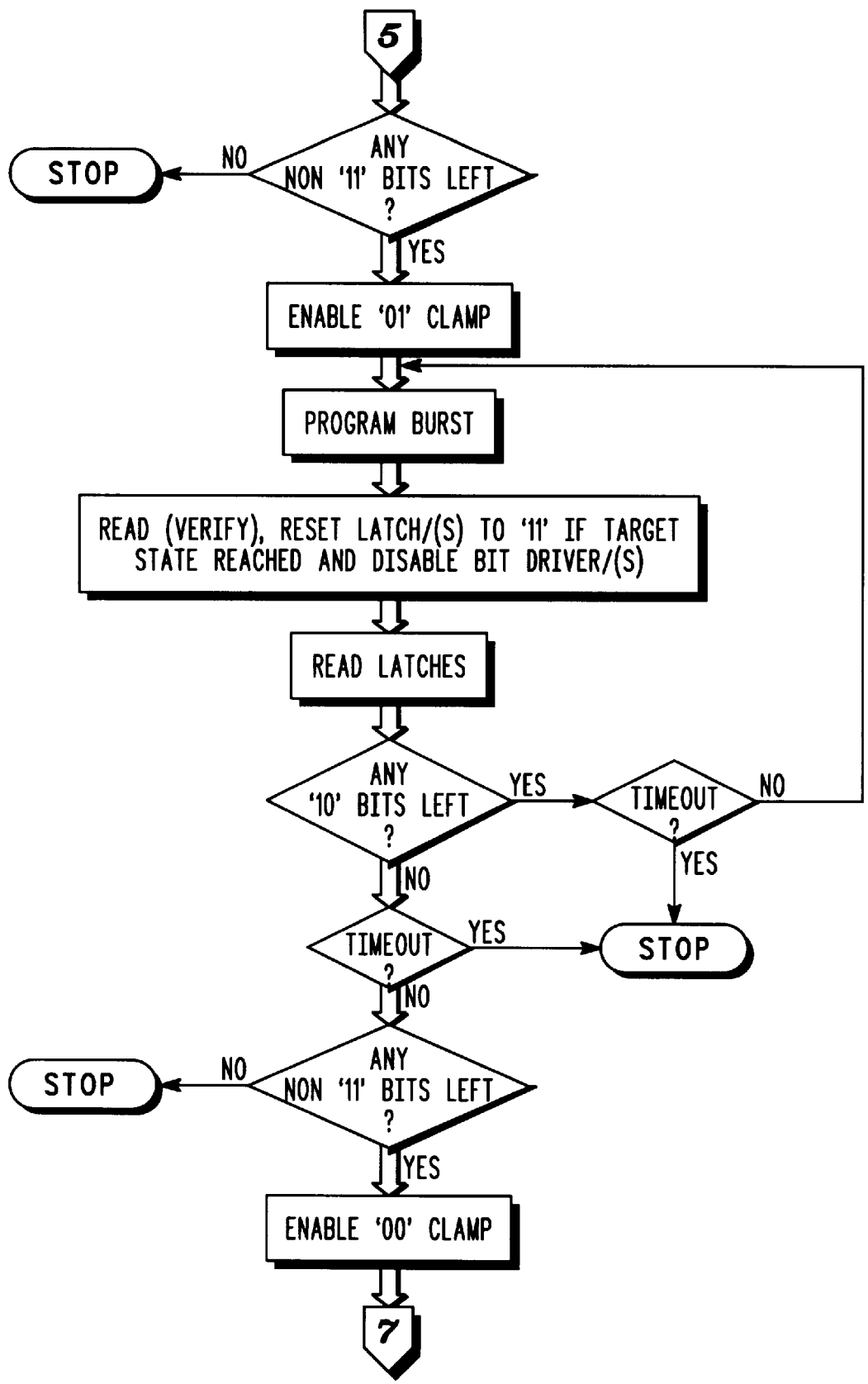
Figure 7:
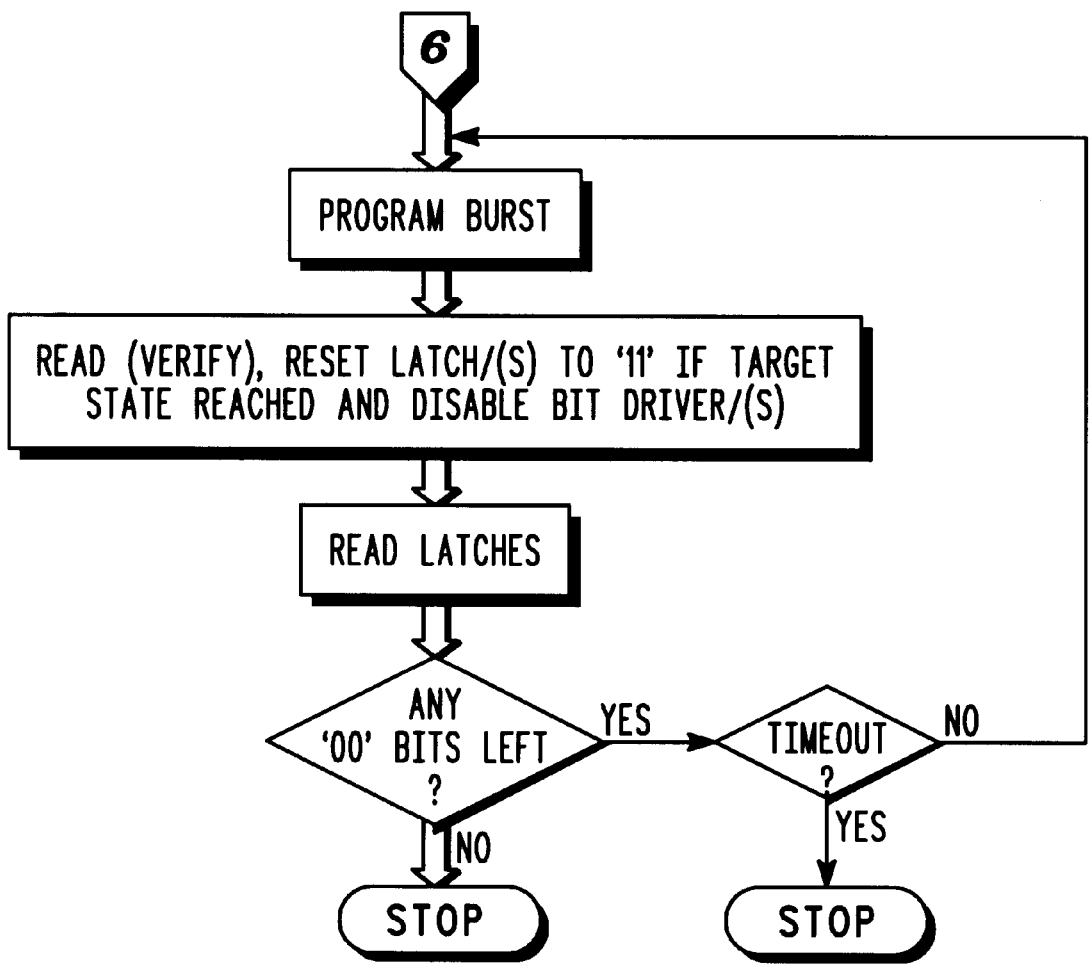
Figure 8:
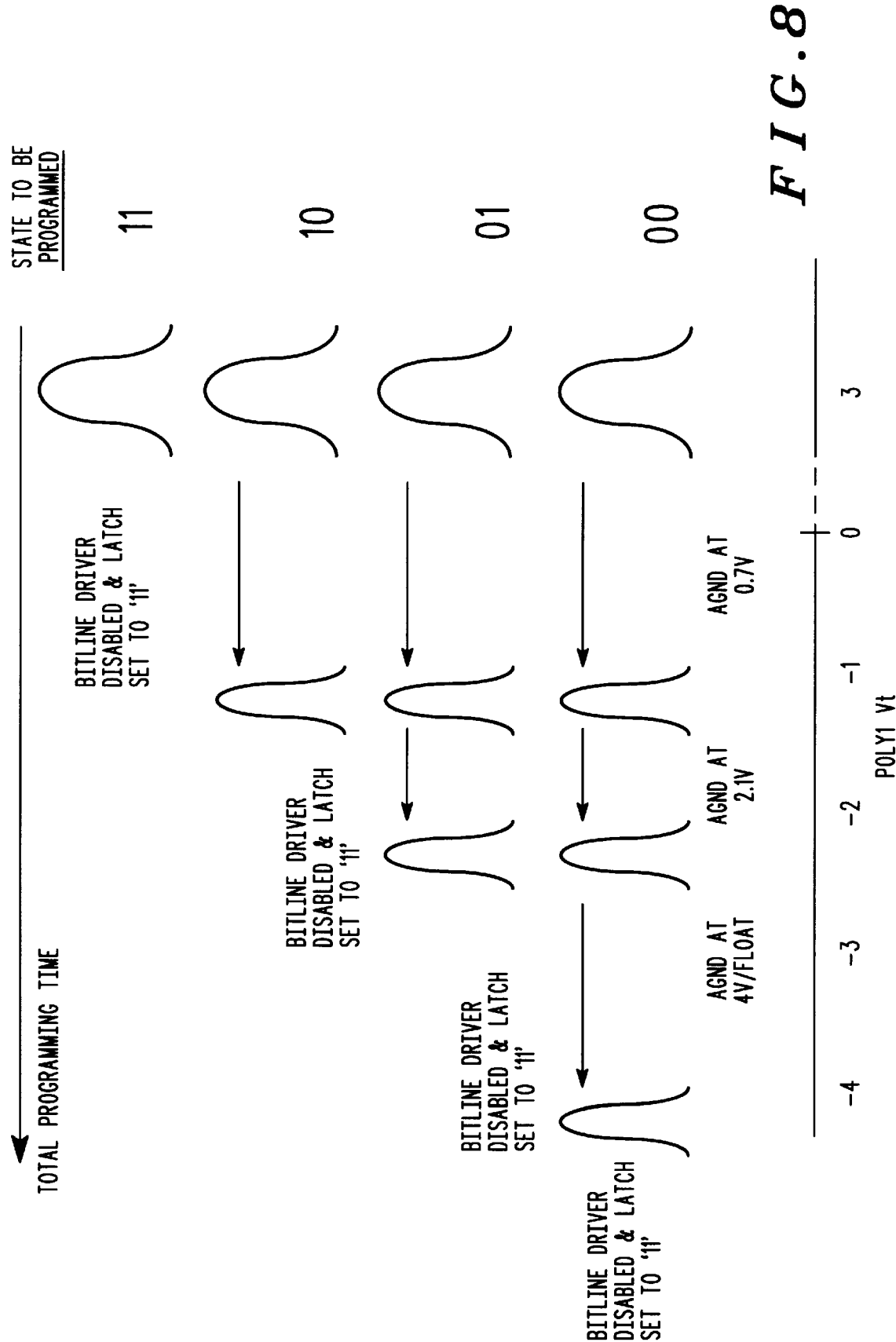
FIG. 8 shows various voltages applied to the byte of the array during multi-level programming thereof.

Referring now to FIG. 4, 8 and the flowchart of FIGS. 6–7, a first programming scheme which overcomes these difficulties is based on the following:

Consider firstly an isolated logical byte, consisting of four identical cells, and consider for the purpose of illustration that each byte is to be set to a different one of the four states corresponding to FIG. 1, namely '11' (erased or unprogrammed), '10', '01' and '00' (most programmed).

In order to program each cell to its correct state with a common array ground, each cell starts from the erased state ('11') and each cell must transcend the previous program level or levels in order to reach a more programmed level (more negative Vt). Specifically, the '00' state must be reached by passing from '11' state through '10' and '01', the '01' state must be reached by passing from '11' state through '10' and the '10' state must be reached by passing from '11', the '11' state requiring no programming. This is then combined with having a different array ground clamp level for each of the states in turn. Finally, the programming bias is disabled for bitlines where the bit has reached its target state by using a read-before-program-pulse iterative scheme (for each state), that reads the state of each cell in turn (single byte read verify or burst of single byte read verifies) and latches the data in the bit driver latches (controls the bit driver output—see FIGS. 4, and 9). For the read verify operation, offset reference currents (corresponding to the read voltage levels R1, R2 and R3, which are offset from the programming voltage levels P1, P2 and P3 respectively—see FIG. 1) are used. This ensures the programmed state has sufficient margin and is always read correctly across temperature and specified reliability stress variations. Also, the latched data from the selected bit drivers are used to select the single reference current per MLC sense amp block (FIG. 4) required for the read verify. It is to be noted that selecting the reference current using the latched data (initially latched program data) and comparing directly with the cell current, avoids any complex comparisons using the output data from the sense amp blocks.

Since the data state for no programming is '11', the bit latches for cells having reached target Vt can simply be set to the '11' condition and then using either state logic or embedded CPU (if available), a determination is made as to whether all the cells have reached the current program Vt target (i.e., whether any non-'11' latches remain). If so, the array ground clamp is changed to its next value and the programming step is repeated. Finally, a determination is made as to whether programming has been completed—signified by available either a predetermined program time having expired (timeout) or all bit latches set to '11'.

When consider a particular byte or word erasable array architecture for practical multi-level implementation using the above programming scheme, other design elements must be considered, such as bitline leakage through unselected programmed cells and the need to dedicate a bit driver per bitline within each programming block. The latter is required in order that the programming voltage drops only if the cell is at or above the clamp voltage, and not due to (for example) a cell in a neighbouring (sharing the same driver) bitline which is conducting. In addition, it is desirable to keep the resistance in the read path (select gate to sense amp) as low as possible, but to add resistance to the programming path in order that the bitline programming voltage drops significantly even at low currents and without requiring substantial output current from the charge pump (see FIGS. 3, 9 and 10). However this adds further complexity and enhances the need to reduce other leakage currents. The common bitline and row leakages can be reduced to an acceptable level by ensuring that the unselected row and column select signals are at 0V. Depending on the process, this may require some junction drain engineering to avoid gate aided junction issues, caused by having 0V on the gate of transistors and high voltages (high voltage charge pump range) on the drain (e.g., very high voltage transistors in the column select circuitry.

Figure 11:
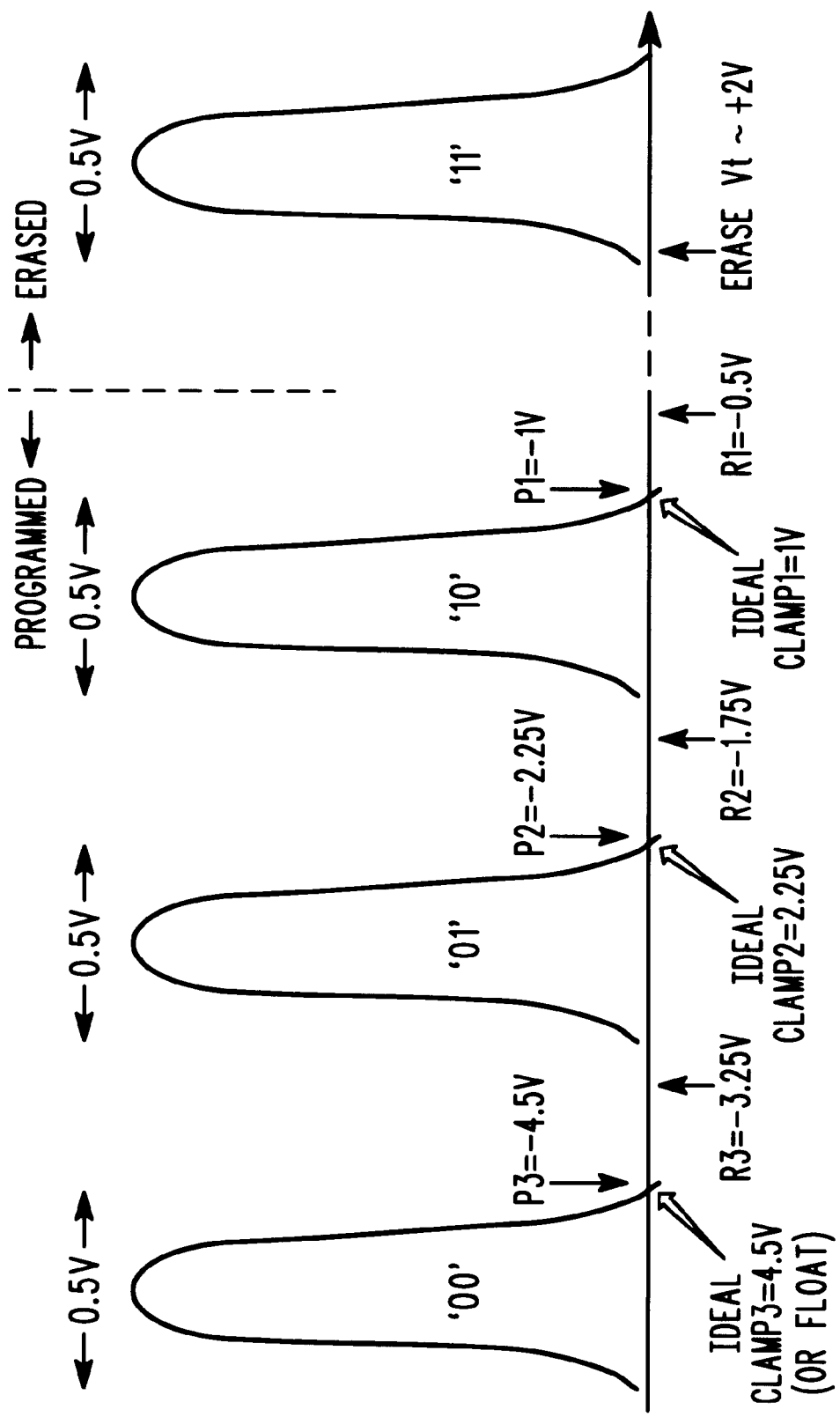
FIG. 11 shows voltage levels used with self-limiting program clamps in the cell of FIG. 10.

Ideally, the array ground clamps should be set to the same voltage references used for read verify current reference current generation (see FIG. 11). However, the clamps used in practice will be a compromise between the stability of structures available, the clamping voltages they can generate, the target programming Vt's required and the programming time available. The latter consideration arises due to the fact that clamp voltages set just below the target program reference points can achieve optimum Vt distribution widths, but at the expense of long program times.

Figure 5:
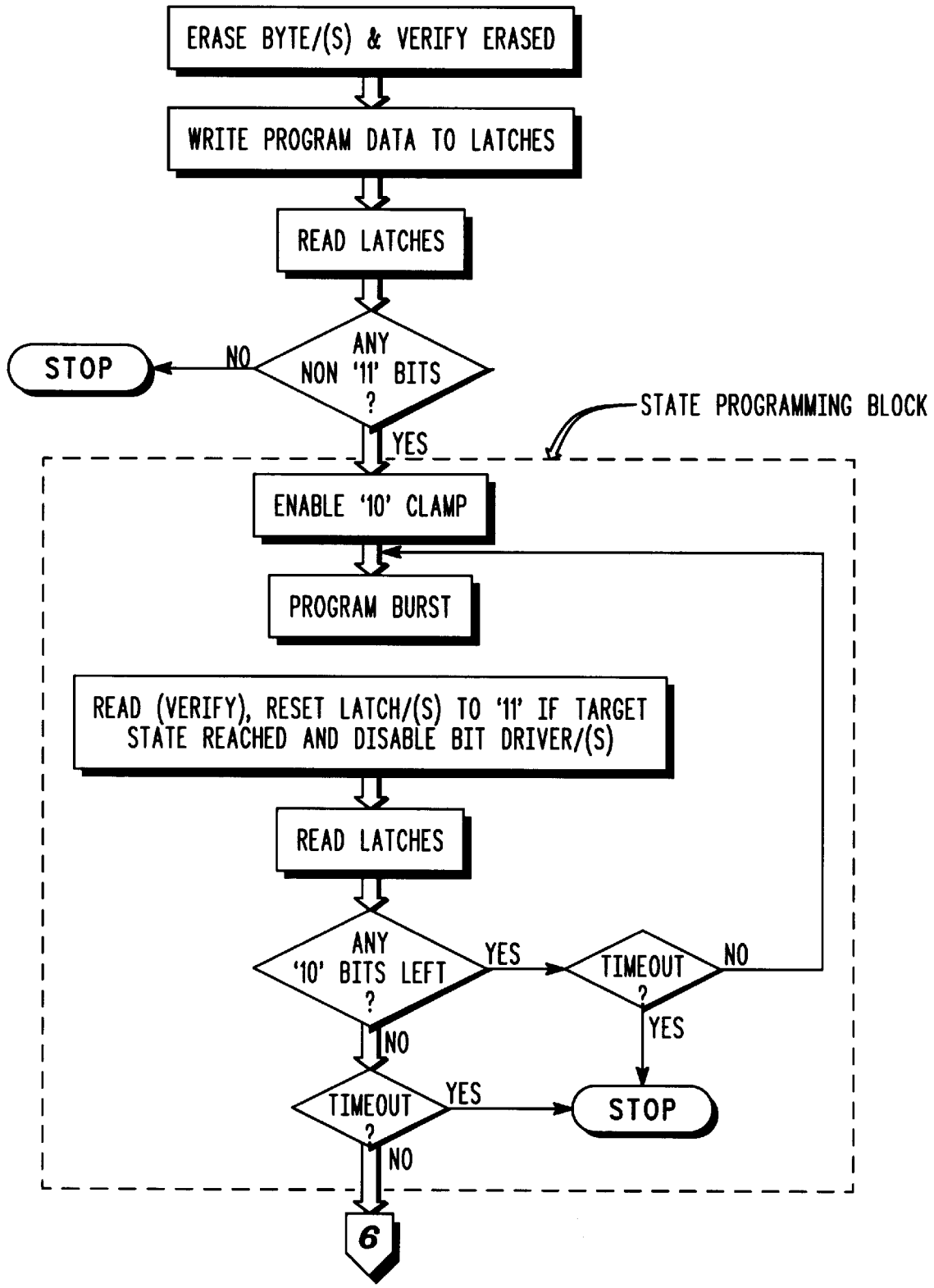
FIG. 5, 6 and 7 show a flow chart illustrating multi-level programming of a byte of the array.

In a second programming scheme, which is a variation of the first programming scheme and which also overcomes the difficulties discussed above, the same common array ground scheme, clamping schemes, bitline driver circuitry and array configuration are used in the first programming scheme. The only differences are that a modified algorithm and circuitry are used to pre-sort the cells into the final required states. The different states are then programmed using the previous algorithm state programming blocks [see FIG. 5], but in this case the cells are not programmed in increments with clamping at each preceding state before moving on, but programming is directly to the required state using a single clamp voltage. The cells are thus grouped by target state and each state is programmed sequentially (order not critical) with a unique clamp voltage.

Clearly, this second programming scheme also offers similar advantages as the first programming scheme, although in the second programming scheme the logic to carry out the sorting may not be so simple, it may need additional latches/registers to store the intermediate or final state values and it may also require more intervention from state logic or CPU. However, the second programming scheme does have a potential programming time advantage gained by reducing the average number of bitlines biased to Vpp during multiple byte programming and hence potentially the load on the high voltage charge pump (all bits in selected bytes programmed to same state (worst case))would be no different. This is most critical for the slowest cell(s) in the group to be programmed, (which determine the total programming time for each state), since for any of the program levels in the first programming scheme, as each cell conducts the charge pump loading will increase. Depending on the charge pump characteristics and operating conditions (also programming path resistance), the charge pump output voltage may drop a little, with the last bit to program during any program burst seeing the lowest programming voltage of all. The significance of this effect will increase with the number of bitlines programmed in parallel and hence, pre-sorting the bits would help reduce average programming time. However, in some applications an external Vpp supply could be used to avoid this output drop, obviating this difficulty.

This effect could also be reduced by decreasing the programming pulse width under the above schemes in conjunction with disabling the bitline programming bias for "fast" cells after each read verify operation. However, to use very narrow pulses could be very inefficient due to the finite rise time required for each pulse (for W/E endurance) and the increased number of pulses required and may in practice add to the overall programming time In conclusion, it will be realised that both the first and second multi-level byte programming schemes described above will result in tight programmed Vt distributions which are largely independent of variables such as tunnel thickness and charge pump output voltage, and are dependent principally on the design and process stability of the array ground clamps.

It will be appreciated that other variations will occur to a person of ordinary skill in this art, without departing from the present invention.

For example, it will of course also be appreciated that although in the above examples a multi-level $e^2$PROM cell array was described, the invention is not limited to an $e^2$PROM cell, but is generally applicable to any electrically programmable memory, such as 'flash', memory, that uses fowler-Nordheim (FN) tunnelling as a charge transfer mechanism.

What is claimed is:

1. A method of programming an electrically programmable memory comprising:

a floating gate FET cell having:
a control electrode;
a drain electrode, and
a source electrode;
the method comprising:
applying to the control electrode a substantially constant control voltage;
applying to one of the drain and source electrodes a first voltage for a programming time, the first voltage being selectable so as to determine the multi-level value programmed into the cell, whereby the threshold voltage of the cell is self limiting in dependence on the first voltage; and
applying to the other of the drain and source electrodes a succession of voltage pulses during the programming time; and
determining after each of the succession of the voltage pulses whether the cell is programmed to a desired value.

2. A method of programming an electrically programmable memory according to claim 1 wherein applying to one of the drain and source electrodes a first voltage for a programming time comprises sequentially applying a succession of different levels of the first voltage each for a programming time.

3. A method of programming an electrically programmable memory according to claim 2 wherein applying to one of the drain and source electrodes a first voltage for a programming time comprises applying the first voltage simultaneously to a plurality of cells of the memory so as to allow simultaneous multi-level programming of the plurality of cells.

4. A method of programming an electrically programmable memory according to claim 1 wherein the substantially constant control voltage is approximately zero volts.

* * * * *